United States Patent
Sforzin et al.

(10) Patent No.: US 10,658,034 B1
(45) Date of Patent: May 19, 2020

(54) DEDICATED READ VOLTAGES FOR DATA STRUCTURES

(71) Applicant: Micron Technology, Inc., Boise, ID (US)

(72) Inventors: Marco Sforzin, Cernusco sul Naviglio (IT); Mattia Robustelli, Milan (IT); Innocenzo Tortorelli, Cernusco sul Naviglio (IT); Mario Allegra, Monza (IT); Paolo Amato, Treviglio (IT)

(73) Assignee: Micron Technology, Inc., Boise, ID (US)

( * ) Notice: Subject to any disclaimer, the term of this patent is extended or adjusted under 35 U.S.C. 154(b) by 9 days.

(21) Appl. No.: 16/182,101

(22) Filed: Nov. 6, 2018

(51) Int. Cl.
*G11C 13/00* (2006.01)
*G06F 11/10* (2006.01)
*G11C 29/52* (2006.01)

(52) U.S. Cl.
CPC ........ *G11C 13/004* (2013.01); *G06F 11/1068* (2013.01); *G11C 13/0061* (2013.01); *G11C 13/0069* (2013.01); *G11C 29/52* (2013.01); *G11C 2013/0054* (2013.01)

(58) Field of Classification Search
None
See application file for complete search history.

(56) References Cited

U.S. PATENT DOCUMENTS

| 9,535,620 | B2 * | 1/2017 | Kim ...................... G06F 3/0619 |
| 9,715,937 | B1 * | 7/2017 | Pang ...................... G11C 16/26 |
| 9,767,896 | B2 | 9/2017 | Guliani et al. | |
| 2016/0132256 | A1 * | 5/2016 | Jung ...................... G06F 3/061 711/103 |
| 2017/0076810 | A1 * | 3/2017 | Kurosawa .......... G11C 16/3404 |
| 2017/0287564 | A1 * | 10/2017 | Park ...................... G11C 16/26 |

* cited by examiner

*Primary Examiner* — Douglas King
(74) *Attorney, Agent, or Firm* — Brooks, Cameron & Huebsch, PLLC (57) ABSTRACT

In an example, a first data structure can be read with a first read voltage dedicated to the first data structure. A second data structure that stores a larger quantity of data than the first data structure can be with a second read voltage that is dedicated to the second data structure. The first data structure can be with a third read voltage in response to a quantity of errors in reading the first data structure being greater than or equal to a first threshold quantity. The second data structure can be read with the third read voltage in response to a quantity of errors in reading the second data structure being greater than or equal to a second threshold quantity. The read voltages can be based on a temperature of an apparatus that includes the first and second data structures.

25 Claims, 10 Drawing Sheets

| Temperature | LT(VDM1) | LT(VDM2) |
|---|---|---|
| -40C | 5 years | more than 10 years |
| 0C | 1 day | 5 years |
| 25C | 3 hours | 6 months |
| 85C | 30 seconds | 3 hours |

FIG. 8

| Temperature | LT(VDM1) | LT(VDM2) |
|---|---|---|
| -40C | 5 years → 10 years nearly | more than 10 years |
| 0C | 1 day → 3 days | 5 years → more than 10 years |
| 25C | 3 hours → 8 hours | 6 months → 10 years nearly |
| 85C | 30 seconds → 10 minutes | 3 hours → 1 month |

FIG. 9

DEDICATED READ VOLTAGES FOR DATA STRUCTURES

TECHNICAL FIELD

The present disclosure relates generally to apparatus, such as memories, and their operation, and, more particularly, to dedicated read voltages for data structures.

BACKGROUND

Memory systems, such as storage systems, may be implemented in electronic systems, such as computers, cell phones, hand-held electronic devices, etc. Some storage systems, such as solid state drives (SSDs), embedded Multi-Media Controller (eMMC) devices, Universal Flash Storage (UFS) devices, and the like may include non-volatile storage memories for storing host (e.g., user) data from a host. Non-volatile storage memories provide persistent data by retaining stored data when not powered and may include NAND flash memory, NOR flash memory, read only memory (ROM), Electrically Erasable Programmable ROM (EEPROM), Erasable Programmable ROM (EPROM), and resistance variable memory, such as phase change random access memory (PCRAM), three dimensional cross-point memory (e.g., 3D XPoint), resistive random access memory (RRAM), ferroelectric random access memory (FeRAM), magnetoresistive random access memory (MRAM), and programmable conductive memory, among other types of memory.

Memory cells are often arranged in an array architecture and can be programmable to a number of different data states corresponding to one or more data units (e.g., bits). As an example, some memory cells, such as some resistance variable memory cells, can be programmed to low resistance state, corresponding to a low threshold voltage (Vt) state or a high resistance state, corresponding to a high Vt state. In some examples, a resistance variable cell in a lower resistance state can be said to be in a set state, corresponding to a set Vt distribution (e.g., encoded as a logical 1), and a resistance variable cell in a higher resistance state can be said to be in a reset state, corresponding to a reset Vt distribution (e.g., encoded as a logical 0).

Resistance variable memory cells can be rewritten by overwriting them without first erasing them, in some examples. This can be referred to as writing in place. In some examples, resistance variable memory cells can be written out of place to a new location after the new location has been "cleaned" by writing all the cells previously in the set state to the reset state, so that all the cells are in the reset state.

The state of a memory cell can be sensed (e.g., read) by, for example, determining whether the cell changes its resistance state (e.g., experiences a switching event) in response to applying a sensing voltage, that may be referred to as a read voltage or a demarcation voltage, to (e.g., across) the cell. For example, the sensing voltage can be selected to lie in a range of Vts (e.g., a Vt window) between a lower edge of the reset Vt distribution and an upper edge of the set Vt distribution.

DETAILED DESCRIPTION

The present disclosure is directed to technological improvements in apparatus, such as memories and memory systems, and technological improvements in methods (e.g., processes) performed by the apparatus. In the present disclosure, a first data structure, such as a small managed unit (SMU), can be read with a first read voltage that can be dedicated to the SMU. A second data structure, such as a large managed unit (LMU), can be read with a second read voltage that can be dedicated to the LMU. The SMU can be read by a third read voltage in response to a quantity of errors in reading the SMU being greater than or equal to a first threshold quantity. The LMU can also be read by the third read voltage in response to a quantity of errors in reading the LMU being greater than or equal to a second threshold quantity. The read voltages can be based on the temperature of an apparatus that includes the SMU and LMU. The temperature-based read voltages can compensate for the effect of apparatus temperature on the size of the Vt window and can reduce the quantity of errors that can result from reading SMUs and LMUs without temperature-compensated read voltages, such as may be done in prior approaches.

The first read voltage can be based on a drift characteristic of the SMU and can be used to read the SMU at about a characteristic drift time for the SMU for which the second and third read voltages might not be valid to read the SMU, thereby reducing the quantity of errors that could occur with using the second or third read voltages to read the SMU at those times. The second read voltage can be based on a drift characteristic of the LMU and can be used to read the LMU at about a characteristic drift time for the LMU for which the third read voltage might not be valid to read the LMU, thereby reducing the quantity of errors that could occur with using the third read voltage to read the LMU at those times. The second read voltage can be valid to read the LMU for a longer time than the first read voltage, thereby reducing the quantity of errors that could occur at longer times with using the first read voltage to read the LMU at those times. The third read voltage can be valid to read the SMU and LMU for the remainder of the lifetime of the apparatus, thereby reducing the quantity of errors that could occur with using the first and second read voltages to read the SMU and LMU at longer times.

As described herein, the SMU can be read after its reset Vt distribution has drifted for about the characteristic drift time for the SMU, and the LMU can be read after its reset Vt has drifted for about the characteristic drift time for the LMU that can be longer than the characteristic drift time for the SMU. Basing the first read voltage on the drift characteristic of the SMU and the second read voltage on the drift characteristic of the LMU can account for the different characteristic drift times for the SMU and the LMU. 3D XPoint is one type of memory that can have such drift characteristics.

In some examples, the Vts of the memory cells in the reset and set states, and thus the Vt distributions for the reset and set states, can drift with the temperature of the apparatus and with time. As a result, the size of the Vt window can change with temperature and time. For example, the size of the Vt window can shrink with temperature and can change with time at each temperature. As such, a read voltage may be valid for a particular time at a particular temperature as long as the read voltage lies in the Vt window. For example, the time that a read voltage is valid can be referred to as the lifetime of the read voltage. For example, the lifetime of a read voltage may decrease as the temperature of the apparatus increases. When the lifetime of a read voltage is reached, the quantity of errors in reading the memory cells with that read voltage can reach a threshold quantity, above which the quantity of errors becomes unacceptable.

Figure 1A:
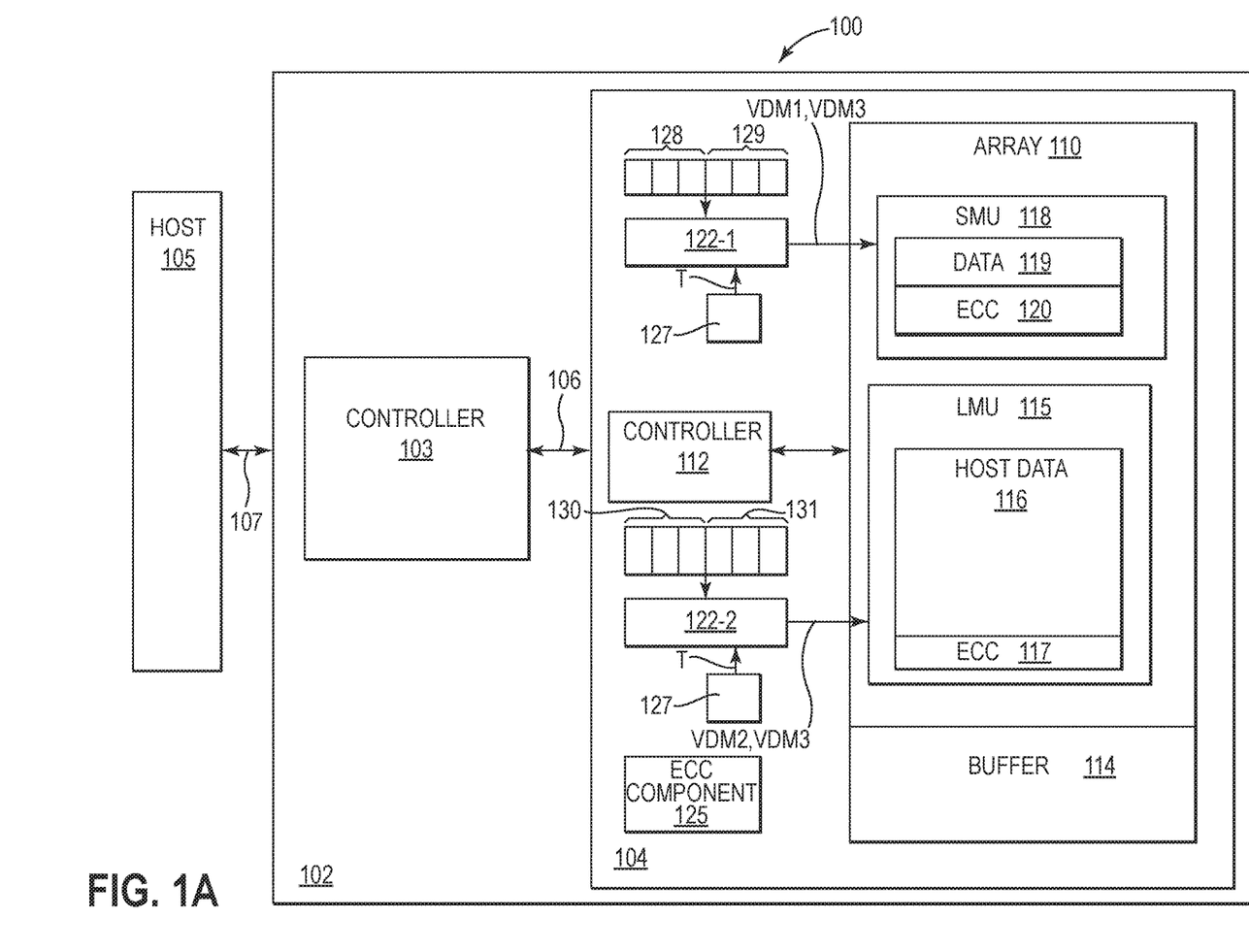
FIG. 1A is a block diagram of an apparatus, in accordance with a number of embodiments of the present disclosure.

FIG. 1A is a block diagram of an apparatus in the form of a computing system 100 in accordance with a number of embodiments of the present disclosure. Computing system 100 includes a memory system 102 that can be, for example, a storage system such as an SSD, a UFS device, an eMMC device, etc. However, embodiments are not limited to a particular type of memory system. For example, memory system 102 could serve as main memory for system 100.

As shown in FIG. 1A, memory system 102 can include a controller 103 that may be referred to as a memory system controller, in that controller 103 can control a memory 104. Controller 103 is coupled to a host 105 and to memory 104. For example, memory 104 can include a number of memory devices (e.g., dies, chips, etc.) and serve as a memory (e.g., main memory) and/or as a storage volume for system 100. Memory 104 can be coupled to controller 103 via an interface 106 (e.g., memory interface) that can include a data bus and that can support various standards and/or comply with various interface types, such as double data rate (DDR), etc. Controller 103 can receive commands, such as read and write commands from host 105. Controller 103 can, for example, receive host data to be written to memory 104 from host 105 via a host interface 107. As used herein, a memory system 102, a controller 103, memory 104, or a controller 112 might also be separately considered an "apparatus."

Host 105 can be, for example, a host system, such as a personal laptop computer, a desktop computer, a digital camera, a mobile device (e.g., cellular phone), network server, Internet of Things (IoT) enabled device, or a memory card reader, among various other types of hosts. For instance, host 105 can include one or more processors capable of accessing memory 104 (e.g., via controller 103) over interface 107 that can include a bus. Interface 107 may be a standardized interface, such as a serial advanced technology attachment (SATA), peripheral component interconnect express (PCIe), or a universal serial bus (USB), among various others.

Memory 104 can include a number of memory arrays 110 (e.g., referred to collectively as array 110) and a controller 112 that may be referred to as an embedded controller. In some examples, array 110 can include 2D and/or 3D array structures, such as cross point (e.g., 3D XPoint) array structures. For example, array 110 can include, for example, non-volatile resistance variable memory cells such as those employing 3D)(Point technology.

Controller 112 can be located internal to the memory 104, and can receive commands (e.g., write commands, read commands, etc.) from the controller 103 via the memory interface 106. Controller 112 can include a state machine and/or a sequencer. Controller 112 can be configured to control the operation of memory 104. A data buffer 114 can be coupled to array 110. For example, data can be read from array 110 into buffer 114, or host data can be received at buffer 114 from controller 103 and subsequently written to array 110.

Memory array 114 can be divided into addressable groups of memory cells that can be written to (e.g., programmed) in response to write commands that address the groups and that can be read in response to read commands that address the groups. In some examples, the groups of memory cells can have a physical address that corresponds to a logical address received from host 105. Controller 103 can include a logical-to-physical (L2P) mapping component that can map the logical addresses from host 105 to the physical addresses of the groups of memory cells. The groups of memory cells can be pages corresponding logical addresses. For example, each group can store a data pattern (e.g., a data structure) that can be referred to as a managed unit, such as a codeword.

In some examples, a particular amount of data, such as a data structure, stored in a group (e.g., a quantity) of memory cells in an array that is managed together during operations can be referred to as a managed unit. The size of a managed unit (e.g., the quantity of memory cells) can vary based on the type of data stored in the managed unit and/or the type of operation performed on the managed unit. For example, a large managed unit (LMU) can include 4 kilobytes of data and can store host data, while a small managed unit (SMU) can include 64 bytes of data and can store a logical to physical table associated with host data, firmware structures (e.g., firmware code), or the like. For example, an LMU can correspond to a larger quantity of memory cells than an SMU. In some examples, management of the managed units can include writing SMUs in place while writing LMUs out of place.

In some examples, array 110 can store a number of large managed units (LMUs) 115 (e.g., referred to collectively as LMU 115). For example, LMU 115 can include host data 116 and error correction code (ECC) data 117. Array 110 can store a number of small managed units (SMUs) 118 (e.g., referred to collectively as SMU 118). SMU 118 can include data 119 and ECC data 120. For example, data 119 can include L2P tables for the host data 116 stored in LMU 115, firmware structures (e.g., firmware code), etc. For example, the L2P tables can be loaded into the L2P mapping component in controller 103 during initialization of memory system 102, and updated L2P tables from the L2P mapping component in controller 103 can be stored in SMU 118 while memory system 102 is powered down.

In some examples, SMU 118 can be updated in place by overwriting the memory cells in the corresponding group in place without first erasing the memory cells. For example, the existing data in SMU 118 can be the result of writing SMU 118 in place. LMU 115 can be updated out of place by writing the data to another LMU that has been cleaned. For example, the existing data in LMU 115 can be the result of writing data from another LMU after LMU 115 is cleaned. Note that writing out of place can operate to wear level the LMUs, for example.

In some examples, SMU 118 can be read with a read voltage VDM1 dedicated (e.g., specific) to SMU 118 that can be generated by read voltage circuitry 122-1, and LMU 115 can be read with a read voltage VDM2 dedicated (e.g., specific) to LMU 115 that can be generated by read voltage circuitry 122-2. For example, read voltage VDM1 may only be used to read SMUs and read voltage VDM2 may only be used to read LMUs. Controller 112 can cause LMU 115 to be read in response to a read command from controller 103 that is received at controller 103 from host 105. Controller 112 can cause SMU 118 to be read in response to a request for data 119 from controller 103.

LMU 115 can be reread with a read voltage VDM3 that can be generated by read voltage circuitry 122-2 in response to a quantity of errors in reading LMU 115 with read voltage VDM2 being greater than or equal to a threshold quantity. SMU 118 can be reread with the read voltage VDM3 that can be generated by read voltage circuitry 122-1 in response to a quantity of errors in reading SMU 118 with read voltage VDM1 being greater than or equal to a threshold quantity. For example, controller 112 can cause LMU 115 and SMU 118 to be reread with read voltage VDM3.

Memory 104 can include an ECC component 125. In some examples, ECC component can be part of controller 103 or controller 112. ECC component 125 can determine the quantity of errors in reading LMU 115 with read voltage VDM2 based on ECC data 117 and can determine the quantity of errors in reading SMU 118 with read voltage VDM1 based on ECC data 120. The quantity of errors in reading LMU 115 with read voltage VDM2 can be specific to LMU 115, and the quantity of errors in reading SMU 118 with read voltage VDM1 can be specific to SMU 115. For example, quantity of errors in reading LMU 115 with read voltage VDM2 can be different than the quantity of errors in reading SMU 118 with read voltage VDM1 because of the difference in sizes of LMU 115 and SMU 118.

In some examples, read voltages VDM1, VDM2, and VDM3 can be based on a temperature T of memory system 104 that is sensed by a temperature sensor 127. For example, the temperature T can be input to read voltage circuitry 122-1 and 122-2. Circuitry 122-1 generates read voltage VDM1 based on the temperature T and on inputs from a set of registers 128 and read voltage VDM3 based on the temperature T and on inputs from a set of registers 129. For example, controller 112 can cause the temperature T and the inputs from the set of registers 128 to be input to circuitry 122-1 to generate read voltage VDM1 and the temperature T and the inputs from the set of registers 129 to be input to circuitry 122-1 to generate read voltage VDM3. As such, controller 112 can be configured to read SMU 118 with read voltages VDM1 and VDM3.

Circuitry 122-2 generates read voltage VDM2 based on the temperature T and on inputs from a set of registers 130 and read voltage VDM3 based on the temperature T and on inputs from a set of registers 131. For example, controller 112 can cause the temperature T and the inputs from the set of registers 130 to be input to circuitry 122-2 to generate read voltage VDM2 and the temperature T and the inputs from the set of registers 131 to be input to circuitry 122-2 to generate read voltage VDM3. As such, controller 112 can be configured to read LMU 118 with read voltages VDM2 and VDM3.

Figure 1B:
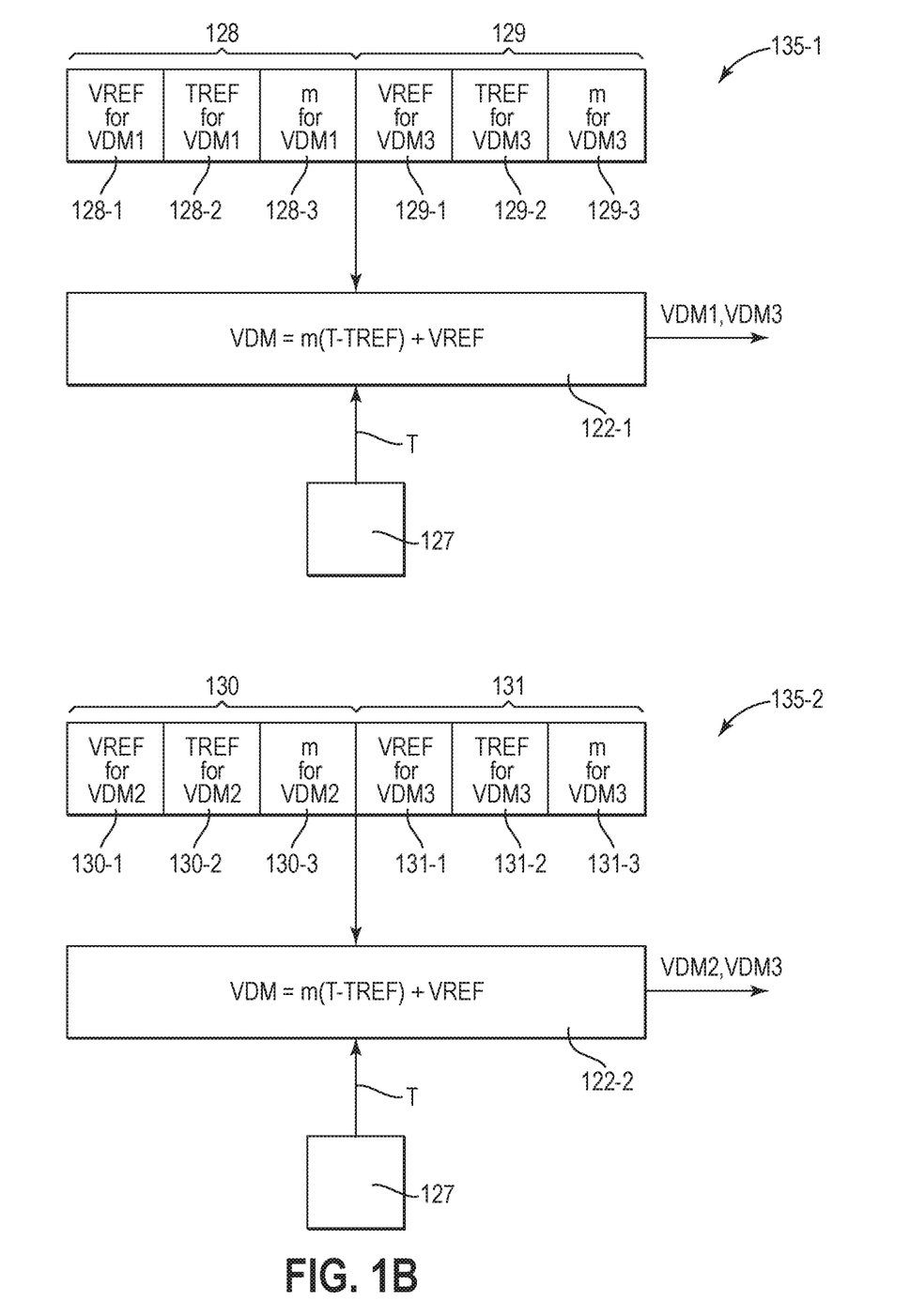
FIG. 1B is a block diagram illustration of the components for generating various read voltages in accordance with a number of embodiments of the present disclosure.

FIG. 1B is a block diagram illustration of the components for generating various read voltages in accordance with a number of embodiments of the present disclosure. For example, FIG. 1B illustrates a component 135-1 to generate read voltages VDM1 and VDM3 to be used to respectively read and reread SMU 118 and a component 135-2 to generate read voltages VDM2 and VDM3 to be used to respectively read and reread LMU 115.

Component 135-1 includes circuitry 122-1, the set of registers 128 to be used in the generation of read voltage VDM1, the set of registers 129 to be used in the generation of read voltage VDM3, and temperature sensor 127. Component 135-2 includes circuitry 122-2, the set of registers 130 to be used in the generation of read voltage VDM2, the set of registers 131 to be used in the generation of read voltage VDM3, and temperature sensor 127. In some examples, there can be a single temperature sensor 127 that can be shared by components 135-1 and 135-2.

As shown in FIG. 1B, circuitry 122-1 generates read voltages VDM1 and VDM3 and circuitry 122-2 generates read voltages VDM2 and VDM3 according to the equation $VDM = m(T - TREF) + VREF$, in which m is a rate of change of voltage (e.g., a read voltage) with temperature, T is the temperature sensed by sensor 127, and VREF is a reference voltage corresponding to a reference temperature TREF. Note that m can represent the "slope" of the equation and can be referred to as the variation of the read voltage with temperature.

The reference voltage VREF, the reference temperature TREF, and the slope m for generating reference voltage VDM1 can be respectively stored in registers 128-1, 128-2, and 128-3 of the set of registers 128. The reference voltage VREF, the reference temperature TREF, and the slope m for generating read voltage VDM2 can be respectively stored in registers 130-1, 130-2, and 130-3 of the set of registers 130. The reference voltage VREF, the reference temperature TREF, and the slope m for generating read voltage VDM3 for SMU 118 can be respectively stored in registers 129-1, 129-2, and 129-3 of the set of registers 129. The reference voltage VREF, the reference temperature TREF, and the slope m for generating read voltage VDM3 for LMU 118 can be respectively stored in registers 131-1, 131-2, and 131-3 of the set of registers 131. Note that the reference voltage VREF, the reference temperature TREF, and the slope m respectively stored in registers 129-1, 129-2, and 129-3 and respectively stored in registers 131-1, 131-2, and 131-3 are the same, so that read voltage VDM3 for SMU 118 and for LMU 115 is the same.

In some examples, the slopes m and the reference temperatures TREF used in the generation of read voltages VDM1 and VDM2 can be the same, and the slope m used in the generation of read voltage VDM3 can be less than the slope m used in the generation of read voltages VDM1 and VDM2. The reference temperature TREF used in the generation of read voltages VDM1 and VDM2 can be at a lower end of (e.g., the lowest temperature) of the range of operating temperatures of memory 104, whereas the reference temperature TREF used in the generation of read voltage VDM3 can be at an upper end of (e.g., the highest temperature) of the range of operating temperatures of memory 104.

In some examples, the reference voltage VREF used in the generation of read voltage VDM1 can be defined at a characteristic start time that corresponds to an elapsed time from when SMU 118 is written to when SMU 118 is first read after being written to. For example, the characteristic start time can correspond to a characteristic drift time for SMU 118 (e.g., in the reset state) and can account for the drift of the Vts of the memory cells corresponding to SMU 118 with time during the characteristic drift time. For instance, when writing data to SMU 118, the data can be written to both SMU 118 and buffer 114. However, up until the characteristic start time, the data may be read from buffer 114 instead of SMU 118. Once the characteristic start time is reached, the data can then be read from SMU 118. As such, read voltage VDM1 can be based on the drift characteristic of SMU 118, for example, the drift of the reset Vt distribution for SMU 118 that can occur during the characteristic drift time for SMU 118.

In some examples, reference voltage VREF used in the generation of read voltage VDM2 can be defined at a characteristic start time that corresponds to an elapsed time from when LMU 115 is cleaned to when LMU 115 is first written to after being cleaned. This can account for the drift in the Vts with time of any memory cells that are already in the reset state prior to cleaning and are thus do not need to be programmed to the reset state during cleaning. As such, read voltage VDM2 can be based on the drift characteristic of LMU 115, for example, the drift of the reset Vt distribution for LMU 115 that can occur during the characteristic drift time for LMU 115.

In some examples, the reference voltage VREF used in the generation of read voltage VDM1 corresponds to a characteristic quantity of set-reset cycles for SMU 118, and the reference voltage VREF used in the generation of read voltage VDM2 corresponds to a characteristic quantity of set-reset cycles for LMU 115 that is less than the quantity of set-reset cycles for SMU 118. In some instances, the reference voltage VREF used in the generation of read voltage VDM2 can be greater than the reference voltage VREF used in the generation of read voltage VDM1, and the reference voltage VREF used in the generation of read voltage VDM1 can be greater than the reference voltage VREF used in the generation of read voltage VDM3.

Figure 2:
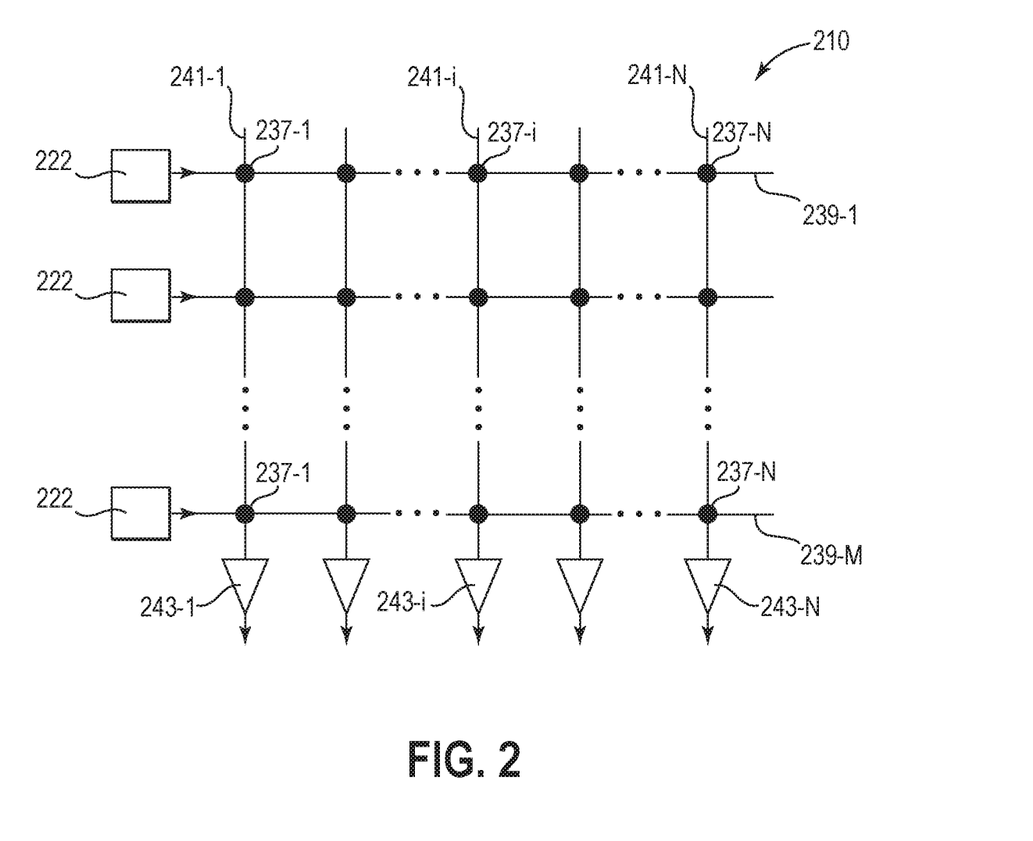
FIG. 2 illustrates a portion of an array of memory cells in accordance with a number of embodiments of the present disclosure.

FIG. 2 illustrates a portion of an array 210 of resistive variable memory cells 237 in accordance with a number of embodiments of the present disclosure. For example, array 210 can be a portion of array 110 in FIG. 1A. In some examples, array 210 can be a tier of a 3D XPoint array that can include a stack of such tiers.

Array 210 includes a respective group of resistive variable memory cells 237-1 to 237-N commonly coupled to each of access lines 239-1 to 239-M that can be referred to as word lines. The respective memory cells 237-1 to 237-N are respectively coupled to respective data lines 241-1 to 241-N that can be referred to as bit lines. For example, there is a memory cell 237 at each data-line-access-line crossing. Sense amplifiers 243-1 to 243-N are respectively coupled to data lines 241-1 to 241-N. Respective read voltage circuitry 222 is coupled to each of the access lines 239-1 to 239-M. For example, read voltage circuitry 222 can be as described above for read voltage circuitry 122-1 and/or read voltage circuitry 122-2.

A group of memory cells 237-1 to 237-$i$ can correspond to an SMU 118, in which case the circuitry 222 coupled thereto can be as described previously for circuitry 122-1 and can supply read voltages VDM1 and VDM3 to group of memory cells 237-1 to 237-$i$. A group of memory cells 237-1 to 237-N can correspond to an LMU 115, in which case the circuitry 222 coupled thereto can be as described previously for circuitry 122-2 and can supply read voltages VDM2 and VDM3 to group of memory cells 237-1 to 237-N. In some examples, a voltage, that can be a ground voltage (e.g., zero (0) volts), can be applied to data lines 241-1 to 241-$i$ while VDM1 or VDM3 is applied to a respective access line 239 to produce a voltage VDM1 or VDM3 minus zero volts across memory cells 237-1 to 237-$i$ to read memory cells 237-1 to 237-$i$ or to data lines 241-1 to 241-N while VDM2 or VDM3 is applied to a respective access line 239 to produce a voltage VDM2 or VDM3 minus zero volts across memory cells 237-1 to 237-N to read memory cells 237-1 to 237-N.

In some examples, resistance variable memory cells, such as memory cells 237, can have a select element (e.g., a diode, transistor, or other switching device) in series with a storage element (e.g., a phase change material, metal oxide material, and/or some other material programmable to different resistance levels). For example, the storage element may be programmed to a state corresponding a value of a fraction of a bit, a single bit, or multiple bits. The select element may be used to access the storage element in the same memory cell.

The select element may include a material, at least a portion of which, may change (e.g., switch) between a non-conductive (e.g., a high resistance) state and a conductive e.g., a low resistance) state. For example, the select element may be turned on (e.g., changed from a high-resistance state to a low-resistance state) to access the storage element. In some examples, the select element may include a variable resistance material (e.g., phase-change material). However, the material of the select element may be such that it may operate only as a switch (e.g., not to store information) to allow access to the storage element. For example, the select element may include a chalcogenide material that may not change phase.

The storage element may include a material, at least a portion of which, may be changed (e.g., via a write operation) between different states (e.g., different material phases). The different states may have a range of different resistance values, for example, to represent different states of a memory cell. For example, the storage element may include a chalcogenide material that may be formed of various doped or undoped materials, that may or may not be a phase-change material, and that may or may not undergo a phase change during reading and/or programming the memory cell. In some examples, the storage element may include a phase change material (e.g., phase change chalcogenide alloy), such as an indium(In)-antimony(Sb)-tellurium(Te) (IST) material (e.g., $In_2Sb_2Te_5$, $In_1Sb_2Te_4$, $In_1Sb_4Te_7$, etc.) or a germanium (Ge)-antimony (Sb)-tellurium (Te) (GST) material (e.g., $Ge_2Sb_2Te_5$, $Ge_1Sb_2Te_4$, $Ge_1Sb_4Te_7$, etc.). The hyphenated chemical composition notation, as used herein, indicates the elements included in a particular mixture or compound, and is intended to represent all stoichiometries involving the indicated elements. Other storage element materials can include GeTe, In—Se, $Sb_2Te_3$, GaSb, InSb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other materials.

In other examples, the resistance variable memory cells may include a material, such as a phase change material, that may act as a select element and a storage element, so that the memory cells can act as both a selector device and a memory element. Some such cells may be referred to as self-selecting memory (SSM) cells.

Figure 3:
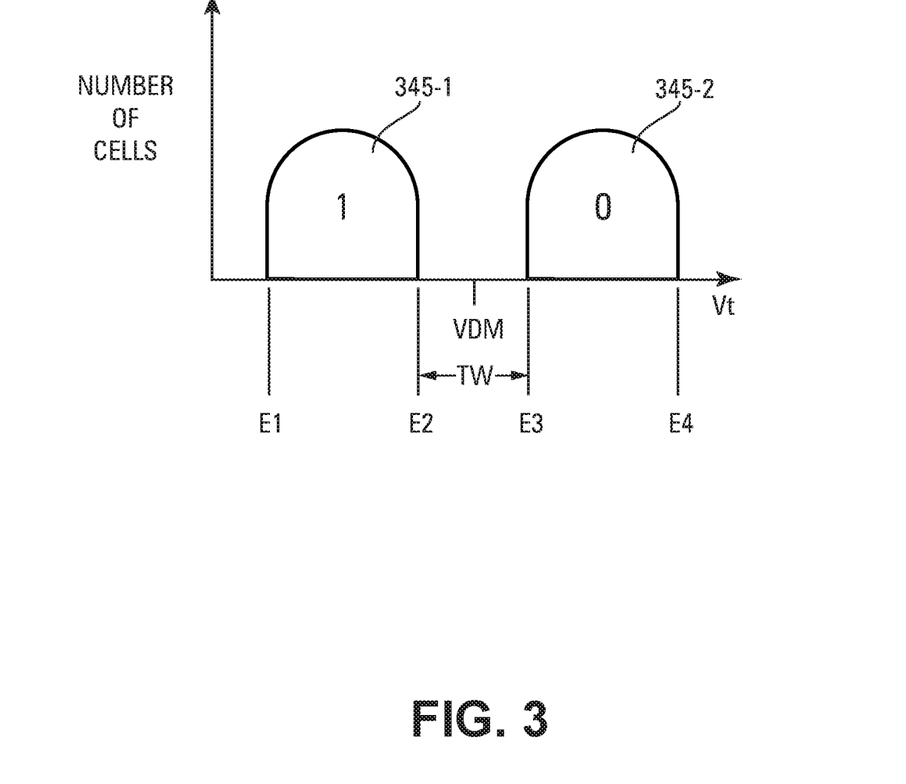
FIG. 3 illustrates threshold voltage distributions corresponding to respective states of memory cells in accordance with a number of embodiments of the present disclosure.

FIG. 3 illustrates threshold voltage distributions 345-1 and 345-2 corresponding to respective states of memory cells, such as the memory cells in SMU 118 or LMU 115 (e.g., memory cells 237) operable in accordance with a number of embodiments of the present disclosure. As an example, distribution 345-1 may be referred to as the set state that can correspond to a low Vt state, and distribution 345-2 may be referred to as the reset state that can correspond to a high Vt state (e.g., a state corresponding to relatively high Vt levels as compared to the Vt levels corresponding to the set state). In this example, distribution 345-1 corresponds to cells programmed to store a logic "1" and distribution 345-2 corresponds to cells programmed to store a logic "0"; however, embodiments are not limited to this assigned encoding.

In FIG. 3, the read voltage VDM can be either read voltage VDM1, read voltage VDM2, or read voltage VDM3 that can be used to determine (e.g., read) the stored state of the cells (e.g., "1" or "0") of SMU 118 or LMU 115. An edge voltage E1 may be defined as the Vt corresponding the lower edge of distribution 345-1; an edge voltage E2 may be defined as the Vt corresponding the upper edge of distribution 345-1; an edge voltage E3 may be defined as the Vt corresponding the lower edge of distribution 345-2; and an edge voltage E4 may be defined as the Vt corresponding the upper edge of distribution 345-2. A Vt window (e.g., margin) TW is the difference between E3 and E2. For example, TW=E3−E2.

Figure 4:
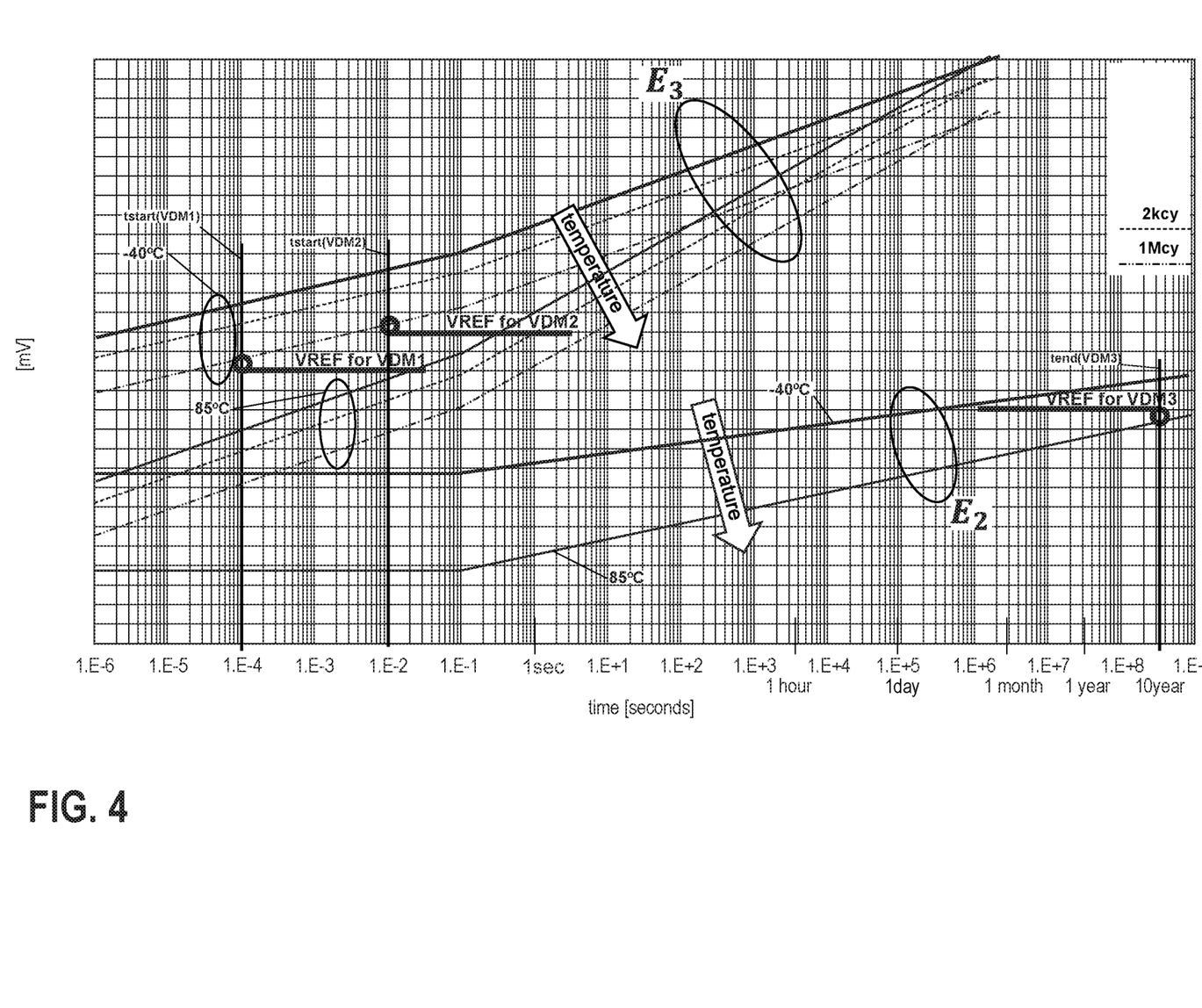
FIG. 4 illustrates selection of the reference voltages for the generation of the read voltages in accordance with a number of embodiments of the present disclosure.
Figure 5:
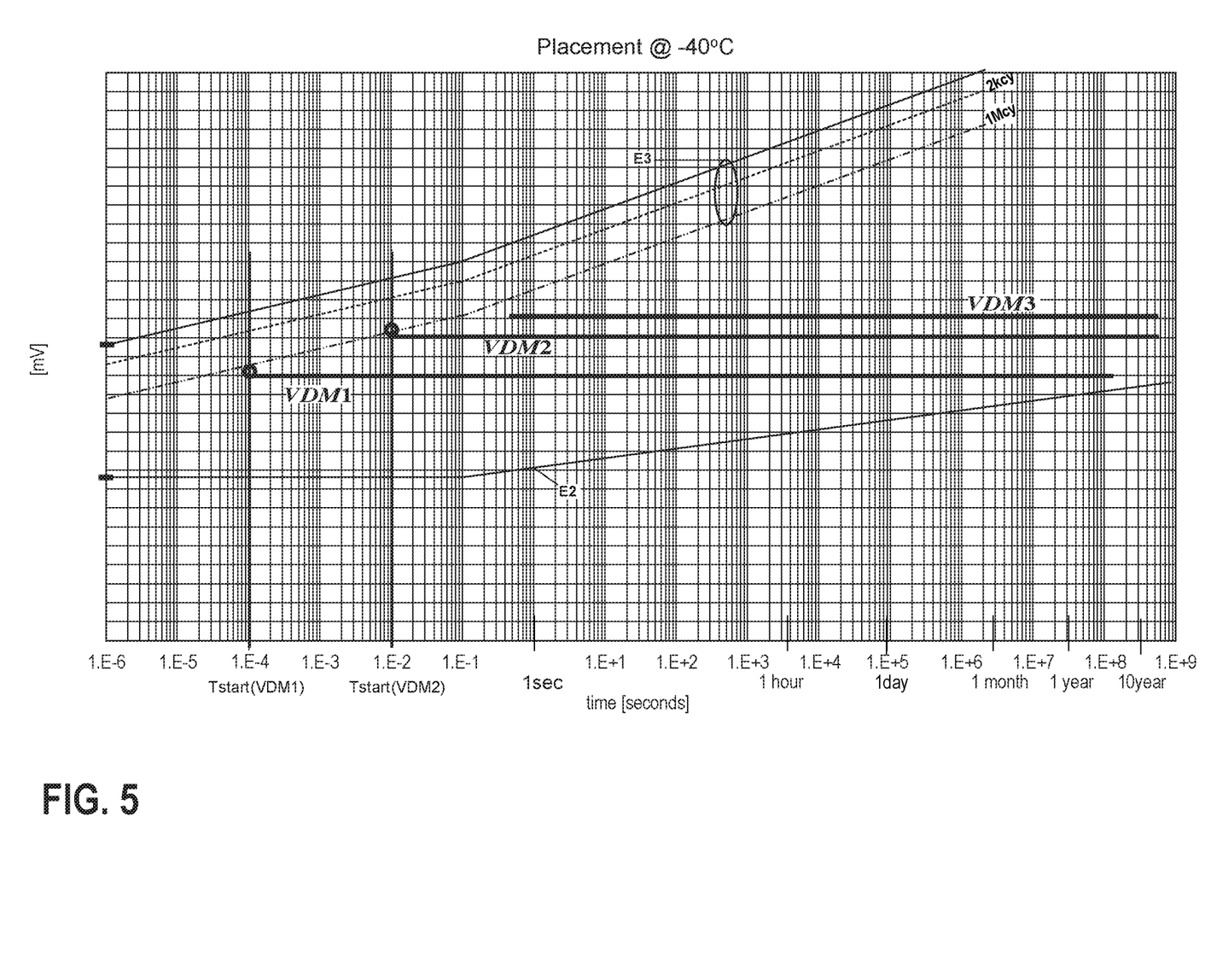
FIG. 5 illustrates placement of the read voltages at a particular operating temperature of a memory in accordance with a number of embodiments of the present disclosure.
Figure 6:
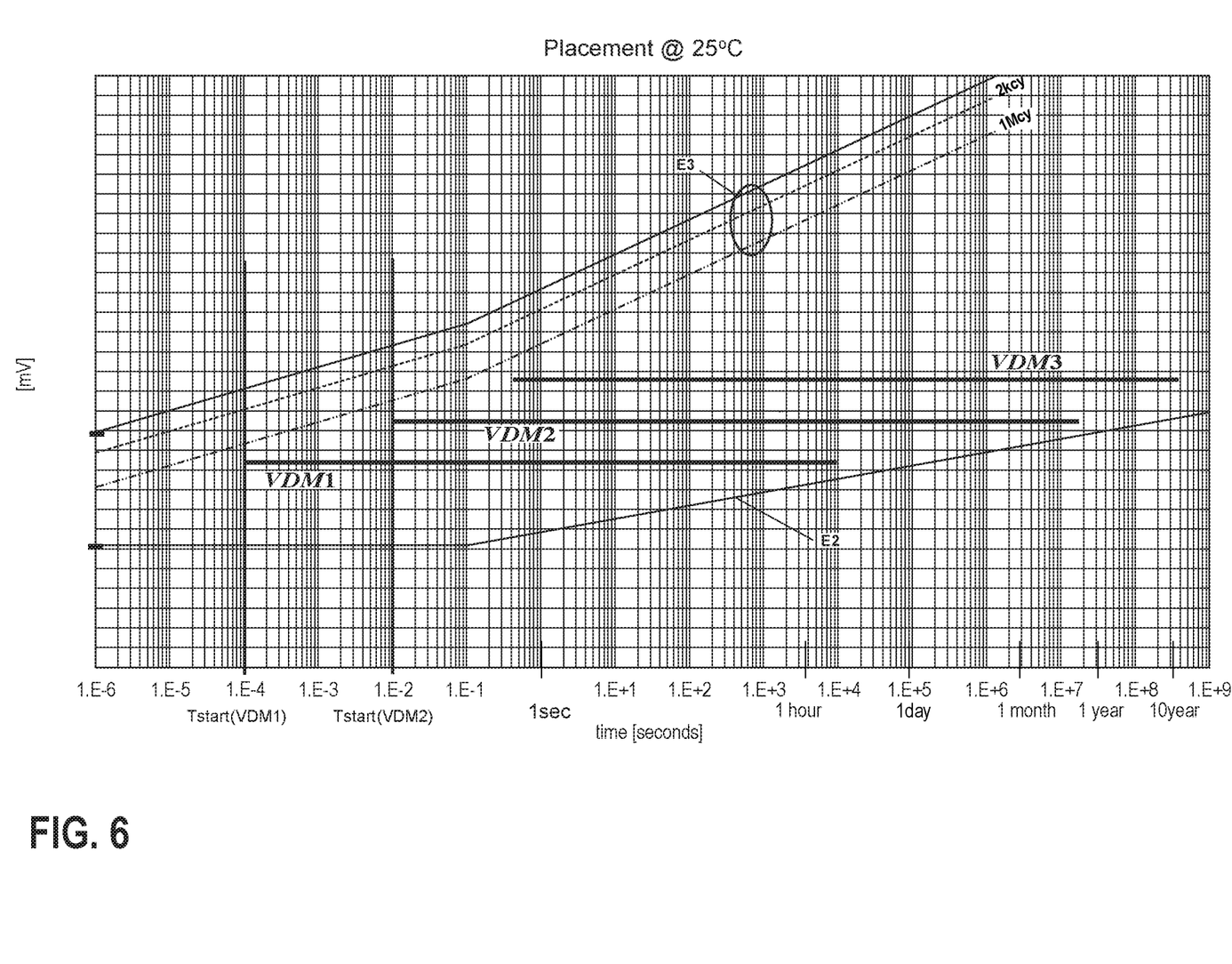
FIG. 6 illustrates placement of read voltages at another operating temperature of a memory in accordance with a number of embodiments of the present disclosure.
Figure 7:
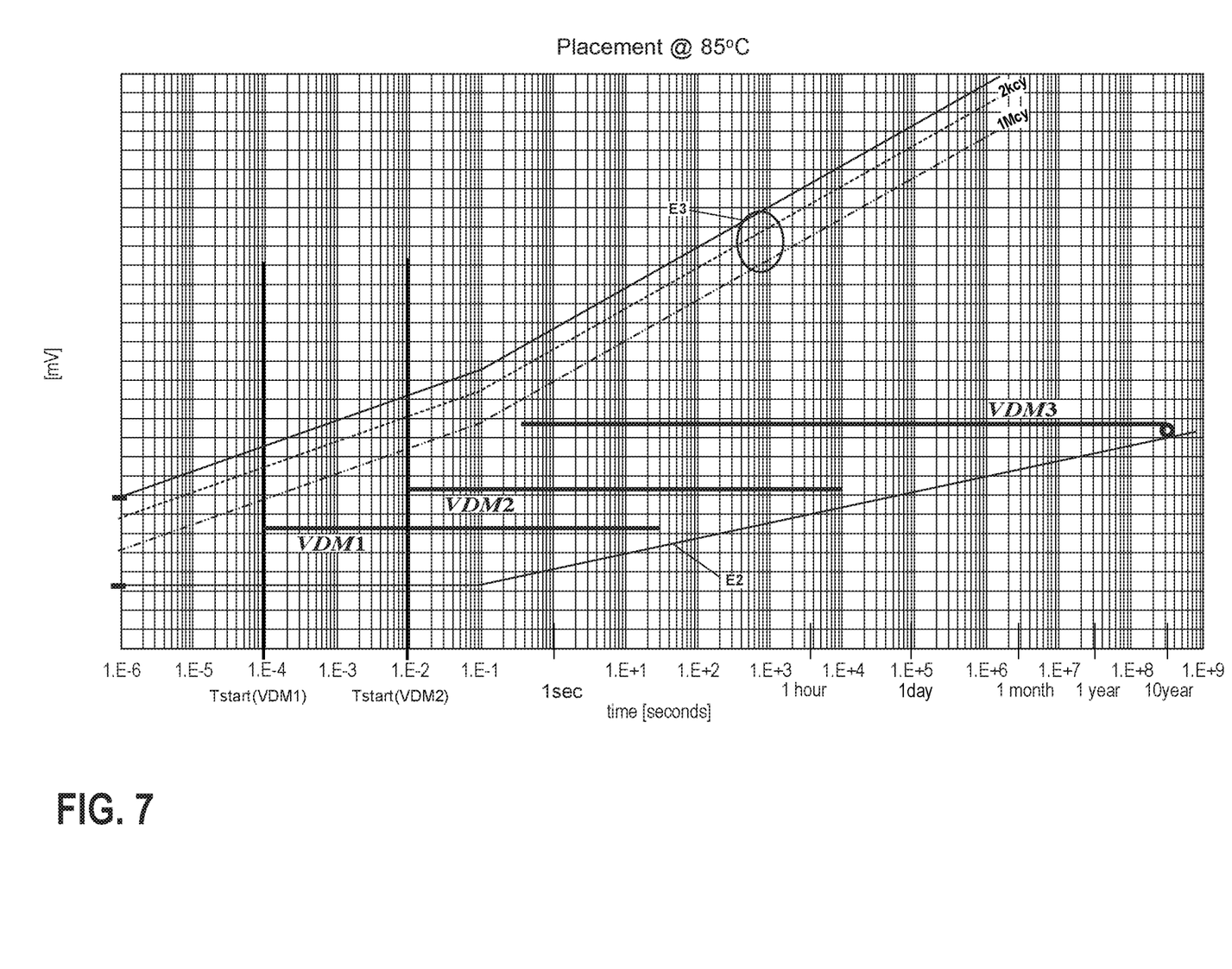
FIG. 7 illustrates placement of read voltages at another temperature of a memory in accordance with a number of embodiments of the present disclosure.

FIG. 4 illustrates the selection of the reference voltages VREF for the generation of the read voltages VDM1, VDM2, and VDM3 in accordance with a number of embodiments of the present disclosure. In some examples, the various curves in FIG. 4 and in FIGS. 5-7 are obtained from modeling based on experimental data for memory cells, such as resistance variable memory cells. In the example of FIG. 4, example plots of the drift of the edge voltage E3 with time at the lower edge of the reset state Vt distribution, such as distribution 345-2 in FIG. 3, are shown at different temperatures in the operating range of memory 104, such as −40° C. and 85° C., and at different quantities of set-reset cycles, such as 2 kilocycles and 1 megacycle, at each temperature. Example plots of the drift of the edge voltage E2 with time at the upper edge of the set state Vt distribution, such as distribution 345-1 in FIG. 3, are also shown at −40° C. and 85° C. For example, the temperatures −40° C. and 85° C. can respectively be the lower and upper bounds of the range of operating temperatures of memory 104. Note that the plots are semilogarithmic plots with the voltage (e.g., the vertical) axis having a linear scale, and the time (e.g., the horizontal) axis having a logarithmic (e.g., $\log_{10}$) scale.

As shown in FIG. 4, both E2 and E3 decrease with temperature. The slope m in register 128-3 used in the equation implemented by circuitry 122-1 for generating read voltage VDM1 for SMU 118 and the slope m in register 130-3 used in the equation implemented by circuitry 122-2 for generating read voltage VDM2 for LMU 115 can be taken to be mE3(@1 microsecond), the rate of decrease of E3 with the temperature of memory 104 at one (1) microsecond (e.g., 1·E-6 seconds) in FIG. 4. For example, $$mE3(@1\ \text{microsecond})=(E3(85)-E3(-40))/(85-(-40))$$

For example, mE3(@1 microsecond could possibly be between about −4 millivolts/° C. and about −8 millivolts/° C.

The slope m in registers 129-3 and 131-3 used in the equations implemented by circuitry 122-1 and 122-2 for respectively generating read voltage VDM3 for SMU 118 and LMU 115 can be taken to be mE2(@1 microsecond), the rate of decrease of E2 with temperature of memory 104 at one (1) microsecond in FIG. 4. For example, $$mE2(@1\ \text{microsecond})=(E3(85)-E3(-40))/(85-(-40))$$

For example, mE2(@1 microsecond could possibly be between about −2 millivolts/° C. and about −6 millivolts/° C.

Note that since E3 decreases at a faster rate than E2 with temperature, the window TW in FIG. 3 may decrease in size with temperature that can lead to errors in reading SMU and LMU without adjusting the read voltages VDM1, VDM2, and VDM3 for the effect of temperature. As such, the embodiments of the present invention can operate to vary the placement of the read voltages in window TW with temperature.

In some examples, the reference voltage VREF in register 128-1 for generating read voltage VDM1 by the equation implemented by circuitry 122-1 and the reference voltage VREF in register 130-1 for generating read voltage VDM2 by the equation implemented by circuitry 122-2 can be defined at TREF=−40° C., but the disclosure is not so limited. For example, the reference temperature TREF in registers 128-2 and 130-2 used in the generation of the read voltages VDM1 and VDM2 can be −40° C. The reference voltage VREF in registers 129-1 and 131-1 for generating read voltage VDM3 by the equations implemented by circuitry 122-1 and 122-2 can be defined at the reference temperature TREF=85° C. (e.g., in registers 129-2 and 131-2), but the disclosure is not so limited.

The reference voltage VREF for read voltage VDM3 can correspond to a lifetime of memory 104 (e.g., about 10 years for the present example). For example, the reference voltage VREF for read voltage VDM3 can correspond to the value of edge voltage E2 at 85° C. at the time 10 years. However, to account for variations in the sense amplifiers, the reference voltage VREF for read voltage VDM3 can be increased by a margin (e.g., about 50 millivolts) for the sense amplifiers to lie in the window TW between edge voltages E3 and E2, as indicated by the top the corresponding open symbol in FIG. 4. For example, the diameter of the open symbol can be the sense amplifier margin. As such, read voltage VDM3 can be based on the edge voltage E2 at 85° C. at a time tend(VDM3), such as 10 years.

VDM1 and VDM2 can be respectively based on the characteristic start times tstart(VDM1) and tstart(VDM2). In the example of FIG. 4, the characteristic start times tstart (VDM1) and tstart(VDM2) respectively for the reference voltages for read voltages VDM1 and VDM2 are respectively taken to be 100 microseconds (e.g., 1·E-4 seconds) and 10 milliseconds (e.g., 1·E-2 seconds), but the disclosure is not so limited.

Note that at each of the temperatures −40° C. and 85° C., the edge voltage E3 decreases with the quantity of set-reset cycles, but the edge voltage E2 is relatively independent of the quantity of set-reset cycles at each of the temperatures −40° C. and 85° C. This means that the window TW may decrease in size with the quantity of set-reset cycles that can lead to errors in respectively reading SMU and LMU. As such, the embodiments of the present invention can operate to account for the effect of the quantity of set-reset cycles by basing the reference voltages VREFS for the read voltages VDM1 and VDM2, and thus the read voltages VDM1 and VDM2 on respective characteristic quantities of set-reset cycles.

In the example of FIG. 4, the characteristic quantities of set-reset cycles can be 1 megacycle and 100 kilocycles for the respective reference voltages VREF for the read voltages VDM1 and VDM2, but the disclosure is not so limited. For example, the reference voltage VREF for the read voltage VDM1 can correspond to (e.g., VDM1 can be based on) a value of E3 at TREF=−40° C., a characteristic start time tstart(VDM1) of 100 microseconds, and a characteristic quantity of set-reset cycles of 1 megacycle. However, to account for variations in the sense amplifiers, the reference voltage VREF for read voltage VDM1 can be decreased by the margin for the sense amplifiers to lie in the window between edge voltages E3 and E2, as indicated by the bottom of the corresponding open symbol in FIG. 4 whose diameter can be the sense amplifier margin. As such, read voltage VDM1 can be based on the edge voltage E3 at TREF=−40° C., a characteristic start time tstart(VDM1) of 100 microseconds, and a characteristic quantity of set-reset cycles of 1 megacycle. For example, read voltage VDM1 can be based on the drift characteristic of SMU 118 that can be the amount of drift of the edge voltage E3 with time occurring at tstart(VDM1).

The reference voltage VREF for the read voltage VDM2 can correspond to (e.g., VDM2 can be based on) a value of E3 at TREF=−40° C., a characteristic start time tstart(VDM2) of 10 milliseconds, and a characteristic quantity of set-reset cycles of 100 kilocycles. However, to account for variations in the sense amplifiers, the reference voltage VREF for read voltage VDM2 can be decreased by the margin for the sense amplifiers to lie in the window between edge voltages E3 and E2, as indicated by the bottom of the corresponding open symbol in FIG. 4 whose diameter can be the sense amplifier margin. As such, read voltage VDM2 can be based on the edge voltage E3 at TREF=−40° C., a characteristic start time tstart(VDM2) of 10 milliseconds, and a characteristic quantity of set-reset cycles of 100 kilocycles. For example, read voltage VDM2 can be based on the drift characteristic of LMU 115 that can be the amount of drift of the edge voltage E3 with time occurring at tstart(VDM2). In some examples, the reference voltage VREF for the read voltage VDM2 can be about 0.2 volts greater than the reference voltage VREF for the read voltage VDM1 and about 0.4 volts greater than the reference voltage VREF for the read voltage VDM3.

FIG. 5 illustrates the placement of the read voltages VDM1, VDM2, and VDM3 at a particular operating temperature (e.g., −40° C.) of memory 104 in accordance with a number of embodiments of the present disclosure. The read voltages are shown on a semilogarithmic graph with the voltage (e.g., the vertical) axis having a linear scale, and the time (e.g., the horizontal) axis having a logarithmic (e.g., $\log_{10}$) scale.

The read voltage VDM1 can start at tstart(VDM1)=100 microseconds and can be generated for T=−40° C. by circuitry 222-1 based on VREF for VDM1, TREF for VDM1, and m=mE3(@1 microsecond) that can be respectively stored in registers 128-1, 128-2, and 128-3. Note that VDM1=VREF for VDM1 at −40° C.

Read voltage VDM2 can start at tstart(VDM1)=10 milliseconds and can be generated for T=−40° C. by circuitry 222-2 based on VREF for VDM2, TREF for VDM2, and m=mE3(@1 microsecond) that can be respectively stored in registers 130-1, 130-2, and 130-3. Note that VDM2=VREF for VDM2 at −40° C.

Read voltage VDM3 can be generated for T=−40° C. by circuitry 222-1 or 222-2 based on VREF for VDM3, TREF for VDM3, and m=mE2(@1 microsecond) that can be respectively stored in registers 129-1, 129-2, and 129-3 and registers 131-1, 131-2, and 131-3. In some examples, at T=−40° C., VDM3 can be about 0.1 volt greater than VDM2 and about 0.3 volts greater than VDM1.

FIG. 6 illustrates the placement of the read voltages VDM1, VDM2, and VDM3 at another operating temperature (e.g., 25° C.) of memory 104 in accordance with a number of embodiments of the present disclosure. The read voltages are shown on a semilogarithmic graph with the voltage (e.g., the vertical) axis having a linear scale, and the time (e.g., the horizontal) axis having a logarithmic (e.g., $\log_{10}$) scale.

Read voltage VDM1 can be generated for T=25° C. by circuitry 222-1 based on VREF for VDM1, TREF for VDM1, and m=mE3(@1 microsecond). Read voltage VDM2 can be generated for T=25° C. by circuitry 222-2 as previously described based on VREF for VDM2, TREF for VDM2, and m=mE3(@1 microsecond). Read voltage VDM3 can be generated for T=25° C. by circuitry 222-1 or 222-2 as previously described based on VREF for VDM3, TREF for VDM3, and m=mE2(@1 microsecond). In some examples, at T=25° C., VDM3 can be about 0.2 volts greater than VDM2 and about 0.4 volts greater than VDM1.

FIG. 7 illustrates the placement of the read voltages VDM1, VDM2, and VDM3 at yet another temperature (e.g., 85° C.) of memory 104 in accordance with a number of embodiments of the present disclosure. The read voltages are shown on a semilogarithmic graph with the voltage (e.g., the vertical) axis having a linear scale, and the time (e.g., the horizontal) axis having a logarithmic (e.g., $\log_{10}$) scale.

Read voltage VDM1 can be generated for T=85° C. by circuitry 222-1 as previously described based on VREF for VDM1, TREF for VDM1, and m=mE3(@1 microsecond). Read voltage VDM2 can be generated for T=85° C. by circuitry 222-2 as previously described based on VREF for VDM2, TREF for VDM2, and m=mE3(@1 microsecond). Read voltage VDM3 can be generated for T=85° C. by circuitry 222-1 or 222-2 as previously described based on VREF for VDM3, TREF for VDM3, and m=mE2(@1 microsecond). Note that VDM3=VREF for VDM3 at 85° C. In some examples, at T=85° C., VDM3 can be about 0.3 volts greater than VDM2 and about 0.5 volts greater than VDM1.

The read voltages VDM1 and VDM2 can be valid while VDM1 and VDM2 are between E2 and E3. The read voltage VDM1 can be valid from tstart(VDM1) up to about the time at which VDM1 is within the sense amplifier margin of edge voltage E2. The read voltage VDM2 can valid from tstart(VDM2) up to about the time at which VDM2 is within the sense amplifier margin of edge voltage E2. For example, the lengths of time for which VDM1 and VDM2 are valid can respectively referred to as the lifetimes of VDM1 and VDM2. The read voltage VDM1 can be used to read SMU 118 for a length of time up to its lifetime from when SMU is written. The read voltage VDM2 can be used to read LMU 115 for a length of time up to its lifetime from when LMU 115 is written. Note that VDM2 is not valid for reading VDM1 from tstart(VDM1) to about tstart(VDM2).

For times greater than the lifetime of VDM1, a relatively large quantity of errors (e.g., an unacceptable quantity of errors) in reading SMU 118 with VDM1 can occur. For times greater than the lifetime of VDM2, a relatively large quantity of errors (e.g., an unacceptable quantity of errors) in reading LMU 115 with VDM2 can occur. As such, SMU 118 can be read with VDM3 in response to the quantity of ECC errors resulting from reading SMU 118 with VDM1 being greater than or equal to a threshold quantity, and LMU 115 can be read with VDM3 in response to the quantity of ECC errors resulting from reading LMU 115 with VDM2 being greater than or equal to a threshold quantity. FIGS. 5 to 7 show that the lifetimes of VDM1 and VDM2 decrease with temperature and that VDM3 is valid for times greater than about 0.5 seconds.

Note that VDM3 is not valid for reading SMU 118 and LMU 115 at relatively short times (e.g., at times less than about 0.5 seconds). As such, VDM1 can be used to read SMU 118 at relatively short times (e.g., corresponding to the lifetime of VDM1); VDM2 can be used to read LMU 115 at relatively short times (e.g., corresponding to the lifetime of VDM2); and VDM3 can be used to read SMU 118 and LMU 115 at relatively long times. For example, VDM3 can be used to read SMU 118 for times greater than or equal to about the lifetime of VDM1 and to read LMU 115 for times greater than or equal to about the lifetime of VDM2. The read voltage VDM1 can be based on the drift of SMU 118 (e.g., the drift in E3) with time that can occur up to tstart(VDM1), and voltage VDM2 can be based on the drift of LMU 115 (e.g., the drift in E3) with time that can occur up to tstart(VDM2).

Figure 8:
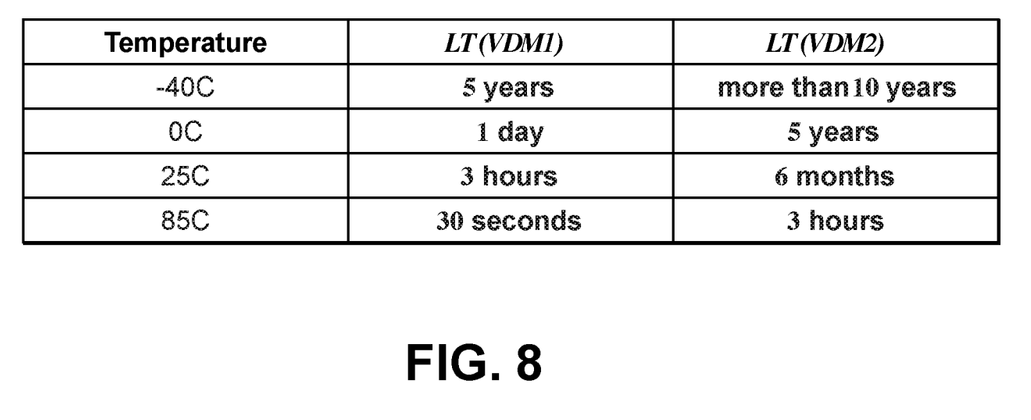
FIG. 8 is a table illustrating an example of the temperature dependency of the lifetime of read voltages in accordance with a number of embodiments of the present disclosure.

FIG. 8 is a table illustrating an example of the temperature dependency of the lifetime LT(VDM1) of VDM1 and the lifetime LT(VDM2) of VDM2 for representative values of the lifetime in accordance with a number of embodiments of the present disclosure. Embodiments of the present disclosure can use the quantity of ECC errors during a read operation to identify the end of the lifetimes of VDM1 and VDM2. As shown in FIG. 8, the lifetimes LT(VDM1) and lifetimes LT(VDM2) can decrease with increasing temperature. For example, the lifetimes LT(VDM1) of VDM1 at −40° C., 0° C., 25° C., and 85° C. can respectively be about 5 years, 1 day, 3 hours, and 30 seconds, and the lifetimes LT(VDM2) of VDM2 at −40° C., 0° C., 25° C., and 85° C. can respectively be about >10 years, 5 years, 6 months, and 3 hours, for some examples. Note that FIG. 8 further illustrates the effect of the start time tstart on the lifetime at the various temperatures because VDM1 is based on tstart(VDM1)=100 microseconds and VDM2 is based on tstart(VDM2)=10 milliseconds. However, as described previously, VDM2 might not be valid for times less than about 10 milliseconds.

In some examples, the slope m=mE3 for generating VDM1 can be evaluated at tstart(VDM1)=100 microseconds at a selected operating temperature T0 of memory 104 instead of 1 microsecond for isothermal operation of memory 104, for example, for a case in which memory 104 operates at a fixed temperature or experiences small variations in temperature throughout its lifetime. For example, for T0=25° C.=298K from FIG. 6, $$mE3(@100 \text{ microseconds})=mE3(@1 \text{ microsecond})+(S(T0)/T0)\log_{10}(t2/t1)$$

in which t2=tstart(VDM1)=100 microseconds, t1=1 microsecond, and S(T0) is the slope of E3 between t1 and t2 in FIG. 6. For example, mE3(@100 microseconds) can possibly be about one millisecond/° C. greater than (e.g., less negative than) mE3(@1 microsecond) and can replace mE3(@1 microsecond) in register 128-3.

For example, mE3(@100 microseconds) can be used by circuitry 122-1 with VREF for VDM1 in register 128-1 and TREF for VDM1 in register 128-2 to compute updated values of VDM1.

In some examples, the slope m=mE3 for generating VDM2 can be evaluated at tstart(VDM2)=10 milliseconds=1·E4 microseconds at T0 instead of 1 microsecond for isothermal operation of memory 104. For example, from FIG. 6, $$mE3(@1·E4 \text{ microseconds})=mE3(@1 \text{ microsecond})+(S(T0)/T0)\log_{10}(t3/t1)$$

in which, t3=tstart(VDM2)=1·E4 microseconds, t1=1 microsecond, and S(T0) is the slope of E3 between t1 and t3 in FIG. 6. For example, mE3(@1·E4 microseconds) can possibly be about one millisecond/° C. greater than (e.g., less negative than) mE3(@1 microsecond) and can replace mE3(@1 microsecond) in register 130-3.

For example, mE3(@1·E4 microseconds) can be used by circuitry 122-2 with VREF for VDM2 in register 130-1 and TREF for VDM2 in register 130-2 to compute updated values of VDM2.

In some examples, the slope m=mE2 for generating VDM3 can be evaluated at 10 years=3.154 E8 seconds at T0 instead of 1 microsecond for isothermal operation of memory 104. For example, from FIG. 6, $$mE2(@3.154E8 \text{ seconds})=mE2(@1 \text{ microsecond})+(S(T0)/T0)\log_{10}(t4/t5)$$

in which, t4=3.154 E8 seconds, t5=1 E-1 seconds, and S(T0) is the slope of E2 between t4 and t5 in FIG. 6. For example, mE2(@3.154 E8 seconds), can possibly be about two milliseconds/° C. greater than (e.g., less negative than) mE2(@1 microsecond) and can replace mE2(@1 microsecond) in registers 129-3 and 131-3. For example, mE2(@3.154 E8 seconds) can be used by circuitry 122-1 and 122-2 with VREF for VDM3 in registers 129-1 and 131-1 TREF for VDM3 in registers 129-2 and 131-2 to compute updated values of VDM3.

Note that the above calculations may be independent of the selected operating temperature T0 because (S(T0)/T0) may be independent of T0. In some examples, VDM3 can be used in place of VDM2 if VDM2 is greater than VDM3.

Figure 9:
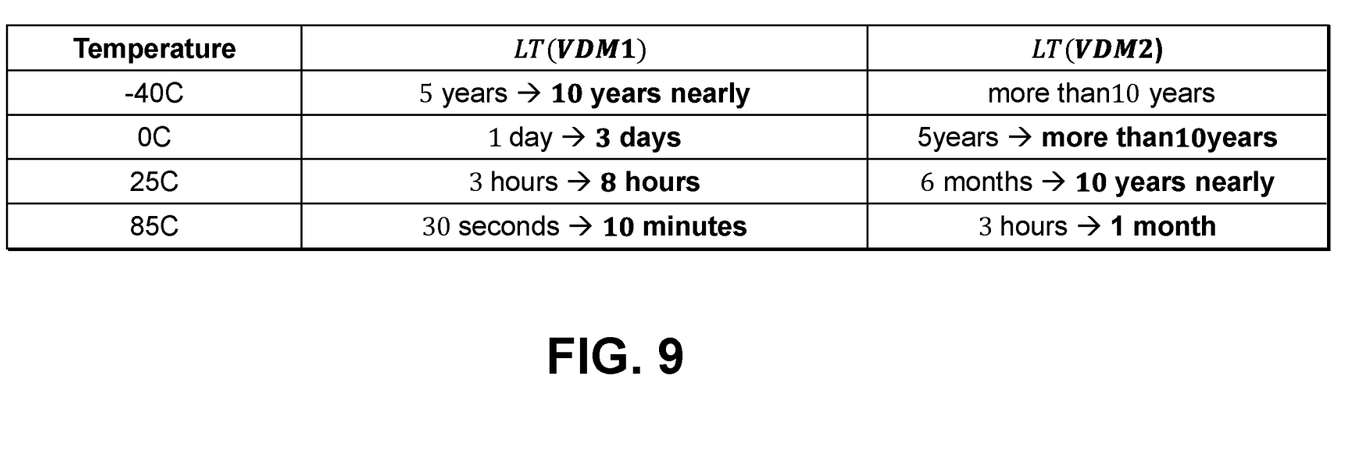
FIG. 9 is a table illustrating the effect of various read voltage generation parameters on the lifetimes of the read voltages in accordance with a number of embodiments of the present disclosure.

FIG. 9 is a table illustrating the effect of various read voltage generation parameters on the lifetimes of the read voltages in accordance with a number of embodiments of the present disclosure. In the center column, the LT(VDM1) from FIG. 8 for VDM1s based the slope mE3(@1 microsecond) are compared to the LT(VDM1) for VDM1s based on the slope mE3(@100 microseconds). For example, basing the VDM1s on the slope mE3(@100 microseconds) instead of mE3(@1 microsecond) acts to increase the LT(VDM1) from about 5 years to nearly 10 years at −40° C., from about 1 day to about 3 days at 0° C., from about 3 hours to about 8 hours at 25° C., and from about 30 seconds to about 10 minutes at 85° C.

In the right column, the LT(VDM2) from FIG. 8 for VDM2s based the slope mE3(@1 microsecond) are compared to the LT(VDM2) for VDM2s based on the slope mE3(@10 milliseconds). For example, basing the VDM2s on the slope mE3(@10 milliseconds) instead of mE3(@1 microsecond) acts to increase the LT(VDM2) from about 5 years to >10 years at 0° C., from about 6 months to nearly 10 years at 25° C., and from about three hours to about 1 month at 85° C.

Note that in FIG. 9, the respective lifetimes at the respective temperatures for the VDM1s based on the slope mE3(@100 microseconds and for the VDM2s based on the slope mE3(@10 milliseconds are for isothermal operation and are valid for the case in which the memory operates at the respective temperatures throughout its lifetime. For example, the lifetime of VDM1 of about 8 hours at 25° C. is valid for the memory operating at about 25° C. throughout its lifetime.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" something can refer to one or more of such things. For example, a number of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. A method, comprising:
   reading a first data structure of an apparatus with a first read voltage dedicated to the first data structure and based on a temperature of the apparatus;
   reading a second data structure of the apparatus that stores a larger quantity of data than the first data structure with a second read voltage that is dedicated to the second data structure and that is based on the temperature of the apparatus;
   reading the first data structure with a third read voltage that is based on the temperature of the apparatus in response to a quantity of errors in reading the first data structure with the first read voltage being greater than or equal to a first threshold quantity; and
   reading the second data structure with the third read voltage in response to a quantity of errors in reading the second data structure with the second read voltage being greater than or equal to a second threshold quantity.

2. The method of claim 1, wherein the first read voltage is based on a first reference voltage defined at a first time and the second read voltage is based on a second reference voltage defined at a second time that is greater than the first time.

3. The method of claim 2, wherein
   the first time corresponds to an elapsed time from when the first data structure is written until when the first data structure is first read after being written to; and
   the second time corresponds to an elapsed time from when the second data structure is cleaned until when the second data structure is first written after being cleaned.

4. The method of claim 3, wherein the third read voltage is based on a third reference voltage defined at a third time corresponding to a lifetime of the apparatus.

5. The method of claim 4, wherein the second reference voltage is greater than the first reference voltage and the first reference voltage is greater than the third reference voltage.

6. The method of claim 2, wherein
   the first reference voltage corresponds to a quantity of set-reset cycles for the first data structure and the second reference voltage corresponds to a quantity of set-reset cycles for the second data structure that is less than the quantity of set-reset cycles for the first data structure.

7. The method of claim 1, further comprising:
   generating the first and second read voltages based on a first rate of change of voltage with temperature; and
   generating the third read voltage based on a second rate of change of voltage with temperature that is less than the first rate of change of voltage with temperature.

8. The method of claim 7, wherein the first and the second rates of change of voltage with temperature comprise the voltage decreasing with increasing temperature.

9. The method of claim 7, wherein
   the first rate of change of voltage with temperature corresponds to a rate of change of a threshold voltage at a lower edge of a reset threshold voltage distribution with temperature; and
   the second rate of change of voltage with temperature corresponds to a rate of change of a threshold voltage at an upper edge of a set threshold voltage distribution with temperature.

10. The method of claim 1, further comprising determining the quantity of errors in reading the first data structure and the quantity of errors in reading the second data structure with error correction codes.

11. The method of claim 1, wherein the third read voltage is greater than the second read voltage and the second read voltage is greater than the first read voltage.

12. An apparatus, comprising:
    an array of memory cells; and
    a controller configured to:
      read a first group of memory cells of the array with a first read voltage that is based on a drift characteristic of the first group and that is based on a temperature of the apparatus and;
      read a second group of memory cells of the array with a second read voltage that is based on a drift characteristic of the second group and that is based on the temperature of the apparatus, wherein the second group comprises a greater quantity of memory cells than the first group;

read the first group with a third read voltage that is based on the temperature of the apparatus in response to determining that the first read voltage is no longer valid; and read the second group with the third read voltage in response to determining that the second read voltage is no longer valid.

13. The apparatus of claim 12, wherein the controller is configured to determine that the first read voltage is no longer valid based on a quantity of errors in reading the first group with the first read voltage being greater than or equal to a first threshold quantity; and determine that the second read voltage is no longer valid based on a quantity of errors in reading the second group with the second read voltage being greater than or equal to a second threshold quantity.

14. The apparatus of claim 12, wherein the second read voltage is valid for a longer time than the first read voltage.

15. The apparatus of claim 12, wherein the drift characteristic of the first group is an amount of drift in a threshold voltage distribution for the first group that can occur during a first particular time; and the drift characteristic of the second group is an amount of drift in a threshold voltage distribution for the second group that can occur during a second particular time that is greater than the first particular time.

16. The apparatus of claim 12, wherein the controller is configured to generate the first read voltage based on a first rate of change of voltage with temperature;

the second read voltage based of a second rate of change of voltage with temperature that is less than the first rate of change of voltage with temperature; and the third read voltage based on a third rate of change of voltage with temperature that is less than the second rate of change of voltage with temperature.

17. The apparatus of claim 12, wherein the first read voltage and the second read voltage are based on threshold voltages at a lower edge of a reset threshold distribution with temperature; and the third read voltage based on a threshold voltage at an upper edge of a set threshold distribution.

18. The apparatus of claim 12, wherein the array of memory cells is an array of resistance variable memory cells.

19. The apparatus of claim 12, wherein the controller is configured to update the first group in place and update the second group out of place.

20. An apparatus, comprising:

an array of memory cells; and a controller configured to:

read a first managed unit of the array with a first read voltage that is based on a temperature of the apparatus and on a characteristic start time of the first managed unit;

read a second managed unit of the array with a second read voltage that is based on the temperature of the apparatus and on a characteristic start time of the second managed unit that is greater than the characteristic start time of the first managed unit, wherein the second managed unit is larger than the first managed unit;

read the first managed unit with a third read voltage that is based on the temperature of the apparatus in response to a quantity of errors in sensing the first managed unit with the first read voltage being greater than or equal to a first threshold quantity; and read the second managed unit with the third read voltage in response to a quantity of errors in reading the second managed unit with the second read voltage being greater than or equal to a second threshold quantity.

21. The apparatus of claim 20, wherein the the characteristic start time of the first managed unit is an elapsed time from when the first managed unit is written to to when the first managed unit is first read after being written to; and the characteristic start time of the second managed unit is an elapsed time from when the second managed unit is cleaned to when the second managed unit is first written to after being cleaned.

22. The apparatus of claim 20, wherein the controller is configured to cause the first read voltage to be generated based on a quantity of set-reset cycles for the first managed unit; and the second read voltage to be generated based on a quantity of set-reset cycles for the second managed unit.

23. The apparatus of claim 20, wherein the controller is configured to cause the first read voltage to be generated based on a first reference temperature, a first reference voltage defined at the characteristic start time of the first managed unit, and a first rate of decrease in voltage with temperature;

the second read voltage to be generated based on the first reference temperature, a second reference voltage defined at the characteristic start time of the second managed unit, and the first rate of decrease in voltage with temperature; and the third sensing voltage to be generated based on a third reference voltage, a second reference temperature, and a second rate of decrease in voltage with temperature.

24. The apparatus of claim 23, wherein the first reference temperature corresponds to a lower end of a range of operating temperatures of the apparatus and the second reference temperature corresponds to an upper end of the range.

25. The apparatus of claim 20, further comprising an error correction code component configured to determine the quantity of errors in reading the first managed unit with the first read voltage and the quantity of errors in reading the second managed unit with the second read voltage.

* * * * *